United States Patent
Chang et al.

(10) Patent No.: US 9,658,316 B2
(45) Date of Patent: May 23, 2017

(54) DEVICE AND METHOD FOR POSITIONING AND CALIBRATING A WAFER TRANSPORTATION APPARATUS

(71) Applicant: Taiwan Semiconductor Manufacturing Co., Ltd., Hsin-Chu (TW)

(72) Inventors: Chi-Wei Chang, Baoshan Township, Hsinchu County (TW); Woo-Guan Chiong, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 727 days.

(21) Appl. No.: 14/143,191

(22) Filed: Dec. 30, 2013

(65) Prior Publication Data
US 2015/0185310 A1   Jul. 2, 2015

(51) Int. Cl.
G06F 7/00       (2006.01)
G01S 5/10       (2006.01)
H01L 21/68      (2006.01)
H01L 21/67      (2006.01)
H01L 21/677     (2006.01)

(52) U.S. Cl.
CPC .......... *G01S 5/10* (2013.01); *H01L 21/67126* (2013.01); *H01L 21/67259* (2013.01); *H01L 21/67742* (2013.01); *H01L 21/68* (2013.01)

(58) Field of Classification Search
None
See application file for complete search history.

(56) References Cited

U.S. PATENT DOCUMENTS

2002/0068992 A1* 6/2002 Hine ................. H01L 21/67259
                                                        700/229
2009/0259337 A1* 10/2009 Harrold .................. B25J 9/1692
                                                        700/245

\* cited by examiner

*Primary Examiner* — Yolanda Cumbess
(74) *Attorney, Agent, or Firm* — McClure, Qualey & Rodack, LLP (57) ABSTRACT

In accordance with some embodiments, a positioning calibration device arranged within a transfer buffer is provided. The positioning calibration device includes at least one target element and at least three positioning modules. The at least one target element is arranged on a wafer transportation apparatus within the transfer buffer. The transportation apparatus is utilized to transfer a wafer. The at least three positioning modules are utilized to detect the positions of the at least one target element by wireless communications for generating position information of the wafer transportation apparatus. The heights which each of the at least three positioning modules arranged at are not the same.

19 Claims, 7 Drawing Sheets

DEVICE AND METHOD FOR POSITIONING AND CALIBRATING A WAFER TRANSPORTATION APPARATUS

BACKGROUND

During the semiconductor manufacturing process, a wafer-transportation apparatus transports the wafer to at least one process chamber for implementing a certain manufacturing process. Generally, the wafer transportation apparatus includes a robot arm, and a paddle or a fork at the end of the robot arm to carry the wafer. The robot arm and the fork are driven by a motor with some belts, screws, cables and pulleys. In order to detect the movements of the wafer transportation apparatus, some encoders are arranged on the motor or the screws for detecting. However, there are still challenges in positioning and adjusting the movements of the wafer transportation apparatus.

BRIEF DESCRIPTION OF THE DRAWINGS

For a more complete understanding of the illustrative embodiments and the advantages thereof, reference is now made to the following descriptions taken in conjunction with the accompanying drawings.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF THE ILLUSTRATIVE EMBODIMENTS

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Figure 1:
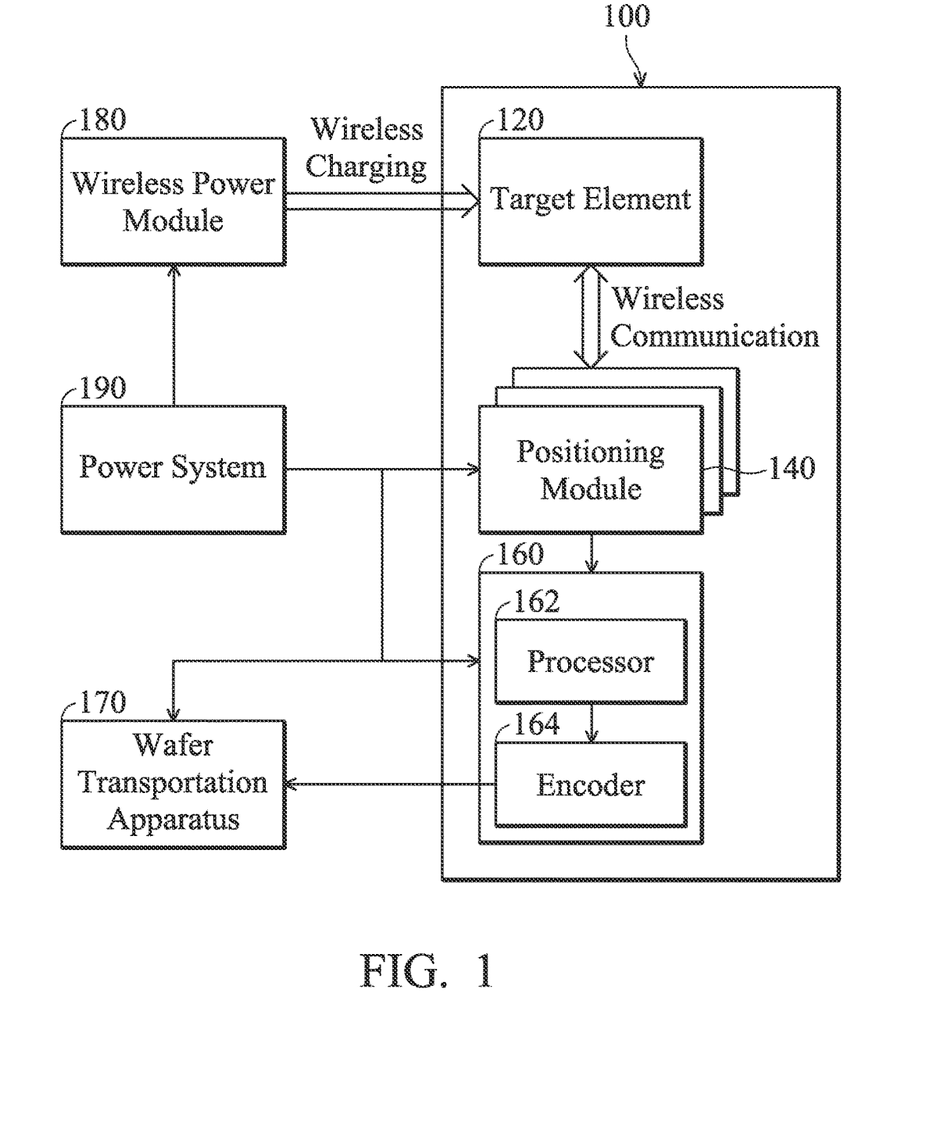
FIG. 1 illustrates a schematic of a positioning calibration device in accordance with some embodiments.

FIG. 1 illustrates a schematic of a positioning calibration device 100 in accordance with some embodiments. The positioning calibration device 100 includes a target element 120, a positioning module 140 and a control unit 160. The control unit 160 includes a processor 162 and an encoder 164. In some embodiments, the positioning calibration device 100 includes at least one target element 120 and at least three positioning modules 140. The target element 120 is placed or arranged on the wafer transportation apparatus 170, and transmits at least one wireless signal to each of the positioning modules 140. The positioning modules 140 receive the wireless signals by wireless communication and determine the position of the target element 120 according to the wireless signals. In other words, the target element 120 and the positioning modules 140 are based on the same protocol to implement wireless communication. For example, the protocol of wireless communication includes GSM, GPRS, EDGE, UMTS, W-CDMA, CDMA2000, TD-CDMA, Bluetooth, NFC, WiFi, WiMAX, LTE, LTE-A and TD-LTE.

In other embodiments, the positioning module 140 generates position information after determining the position of the target element 120, and transmits the position information to the processor 162. Afterwards, the processor 162 analyzes the position information to generate an adjustment signal. Then the encoder 164 receives the adjustment signal from the processor 162 and generates an encoding signal to adjust or control the movement of the wafer transportation apparatus 170. In some embodiments, the control unit 160 continuously detects or monitors the position of the target element 120 according to the position information, especially the height of the target element 120. Because the target element 120 is placed or posted on the wafer transportation apparatus 170, the position of the target element 120 indicates the position of the specific portion of the wafer transportation apparatus 170 where the target element 120 is placed. Therefore, the positioning module 140 can detect the position of the target element 120 as well as the specific portion (such as the paddle or the fork) of the wafer transportation apparatus 170, and the control unit 160 can control and adjust the movements of the wafer transportation apparatus 170 simultaneously. For example, if the movement of the paddle or the fork slightly vibrates or shifts, the wafer may be not transported precisely to a targeted place, or even fall to the ground. The positioning calibration device 100 can simultaneously detect the position of the wafer transportation apparatus 170 and calibrate automatically to prevent problems of not transporting the wafer properly.

As shown in FIG. 1, the target element 120 is wirelessly charged or inductively charged by the wireless power module 180. On the other hand, the positioning module 140, the processor 162 and the encoder 164 are charged or powered by a power system 190. For example, the power system 190 charges the positioning module 140, the processor 162, the encoder 164 and the wireless power module 180 with electrical cables or power wires. In some embodiments, the wireless power module 180 wirelessly charges the target element 120. Specifically, the wireless power module 180 uses an electromagnetic field to transfer energy between the wireless power module 180 and the target element 120. For example, the wireless power module 180 and the target element 120 are based on the same wireless charging standard such as WPC (Wireless Power Consortium), PMA (Power Matters Alliance) or A4WP (Alliance for Wireless Power). Since no electrical cable or power wire is needed for the wireless power module 180 to transfer electric power to the target element 120, the target element 120 could be attached or arranged on any portion of the wafer transportation apparatus 170 in spite of the cable issues. Therefore, the positioning calibration device 100 can reduce the complexity of settling a number of the target elements 120 and operate in a more convenient way.

Figure 2:
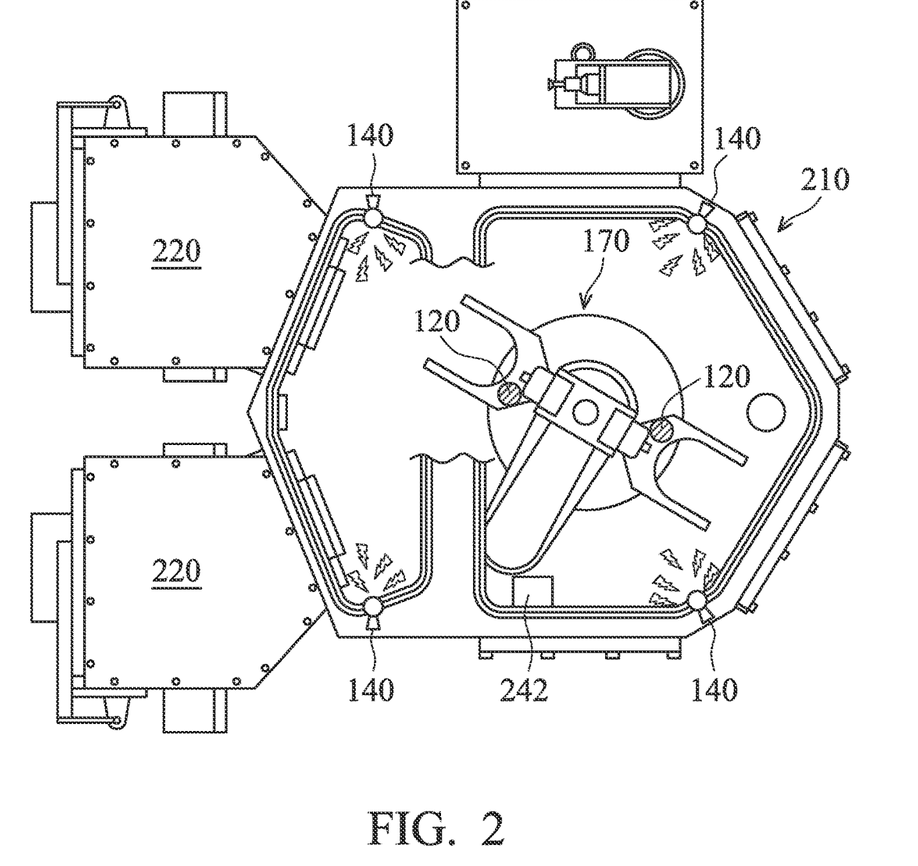
FIG. 2 illustrates a top view of a positioning calibration device in accordance with some embodiments.

FIG. 2 illustrates a top view of the positioning calibration device 100 in accordance with some embodiments. As shown in FIG. 2, the positioning calibration device 100 including a number of target elements 120 and a number of positioning modules 140 is arranged within the transfer buffer 210. The wafer transportation apparatus 170 is located near the center of the transfer buffer 210 with many target elements 120, and is used to transfer the wafer to process chamber 220 for implementing the semiconductor manufacturing process. In addition, the wafer transportation apparatus 170 has at least one fork to carry the wafer. For example, as shown in FIG. 2, the target element 120 is arranged on the fork of the wafer transportation apparatus 170, and the positioning module 140 can detect the position of the fork by the target element 120 on it.

In some embodiments, at least three positioning modules 140 are arranged for a positioning calibration device 100. The accuracy of the positioning calibration device 100 could be improved by more positioning modules 140. However, at least three positioning modules 140 are needed to develop the three-dimensional coordinates for positioning the target element 120. It should be noted that the heights at which each of the positioning modules 140 is arranged are not the same. Therefore, the three positioning modules 140 can provide a precise coordinate for the target element 120, especially the height dimension of the three-dimensional coordinates. In addition, because the positions of at least three positioning modules 140 are arranged in a triangle shape instead of a straight line, the three positioning modules 140 can position the target element 120 more precisely. In other embodiments, as shown in FIG. 2, the positioning modules 140 are arranged or placed at the corners of the transfer buffer, so that the positioning modules 140 can be charged by the power system 190 more easily with electrical cables or power wires. In other embodiments, a reference target element 242 is arranged at a fixed location. Because the location of the reference target element 242 is maintained without changing, three positioning modules 140 can be calibrated according to the reference target element 242. For example, if any one of the three positioning modules 140 is moved and is on another location different from the original location, then the moved positioning module 140 can regard the reference target element 242 as a reference for calibrating and positioning.

Specifically, the target element 120 transmits at least one wireless signal. For example, the target element 120 continuously transmits wireless signals outwardly in all directions. In addition, the target element 120 can transmit wireless signals with a pre-determined frequency or a pre-determined period to reduce the power consumption. Afterwards, the positioning module 140 receives at least one wireless signal from the target element 120 and determines the position of the target element 120 according to the wireless signal. After determining the position of the target element 120, the positioning module 140 generates and transmits position information to the processor 162. In some embodiments, the target element 120 is an RFID tag, and the positioning module 140 is an RFID reader. For example, the target element 120 is an active RFID tag for actively transmitting a wireless signal, and the positioning module 140 (RFID reader) receives the wireless signal to detect the position of the target element 120 (RFID tag).

Figure 3:
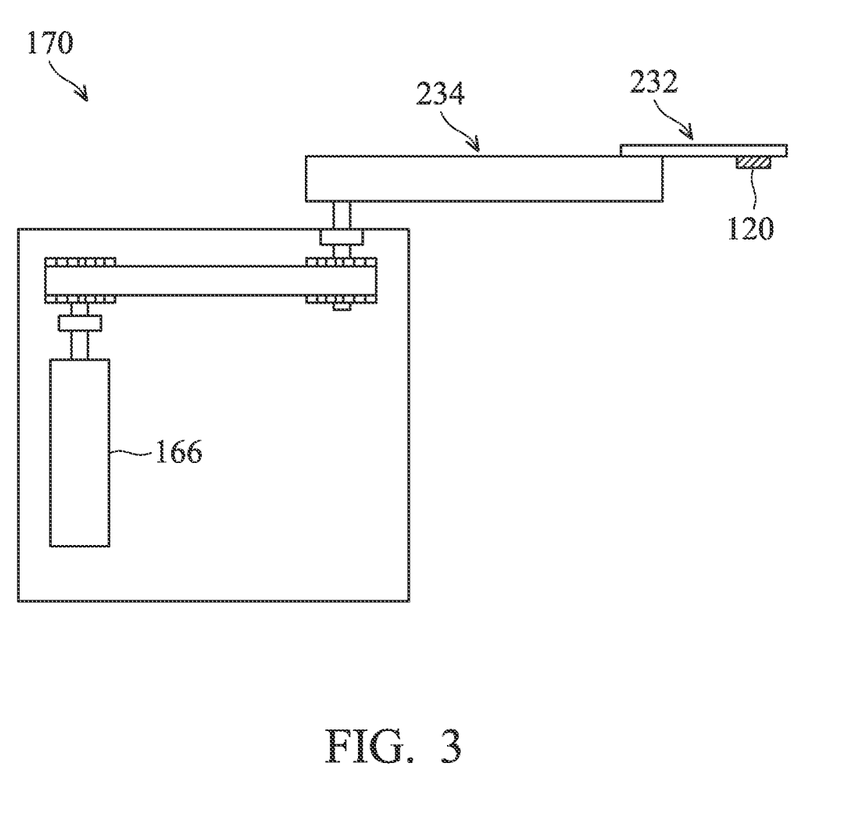
FIG. 3 illustrates a cross-sectional view of a wafer transportation apparatus in accordance with some embodiments.

FIG. 3 illustrates a cross-sectional view of a wafer transportation apparatus 170 in accordance with some embodiments. The motor 166 is arranged to drive or operate the wafer carrying assembly with some belts, screws, cables and pulleys (not shown), and the wafer carrying assembly includes a transfer robot 234 and a fork 232. The fork 232 could be replaced by a paddle to carry the wafer. It should be noted that in order to prevent the target element 120 from affecting or touching the wafer, as illustrated in FIG. 3, the target element 120 is placed under the fork 232 rather than above the fork 232. In some embodiments, the processor 162 receives position information from the positioning module 140 and generates the adjustment signal. Afterwards, the encoder 164 receives the adjustment signal and generates an encoding signal for controlling the movement of the wafer transportation apparatus 170. For example, the encoder 164 could be embedded in the motor 166 or outside the motor 166 to adjust or operate the wafer transportation apparatus 170. In another example, the encoder 164 could be a software program performed or operated by the processor 162.

It should be noted that, in some embodiments, the processor 162 detects or monitors the height of the target element 120 according to the position information from the positioning module 140. If the movement of the fork 232 slightly vibrates or shifts, the wafer may be not transported precisely to the process chamber 220 or even fall to the ground. Therefore, the positioning calibration device 100 provides a method to precisely and rapidly detect the movement and position of the wafer transportation apparatus 170, especially monitoring the height of the wafer transportation apparatus 170 to make sure that the wafer is transported stably and smoothly.

In some embodiments, the processor 162 monitors the height of the wafer transportation apparatus 170 by analyzing the position information with a statistical method and generates the adjustment signal when the standard deviation of the position information exceeds a first value. Specifically, as shown in FIG. 3, the fork 232 has a standard value for its height. The standard value of the height is determined in contrast with the ground. The processor 162 detects the height of the fork 232 for a pre-determined period of time, and analyzes the height of the fork 232 with the statistical method. For example, the processor 162 compares the detected value of the height of the fork 232 to the standard value, and calculates the standard deviation with the statistical method. If the standard deviation of the position information (i.e., the height) exceeds a first control value, it indicates that the movement of the wafer transportation apparatus 170 is out of control (OOC). Afterwards, the processor 162 transmits the adjustment signal to the encoder 164 for calibrating the wafer transportation apparatus 170. In one example, the first control value is three standard deviations.

On the other hand, if the standard deviation of the position information (i.e., the height) exceeds a first specification value, it indicates that the movement of the wafer transportation apparatus 170 is out of specification (OOS). Afterwards, the processor 162 transmits the adjustment signal to the encoder 164 to stop the wafer transportation apparatus 170 for further checking and inspection. In one example, the first specification value is five standard deviations. Therefore, the present disclosure provides the positioning and calibration method with at least one target element 120, at least three positioning module 140 and a processor 162 to analyze the position of the wafer transportation apparatus 170. Therefore, the movement and position of the wafer transportation apparatus 170 can be detected rapidly and calibrated automatically before it functions improperly or breaks down.

Figure 4A:
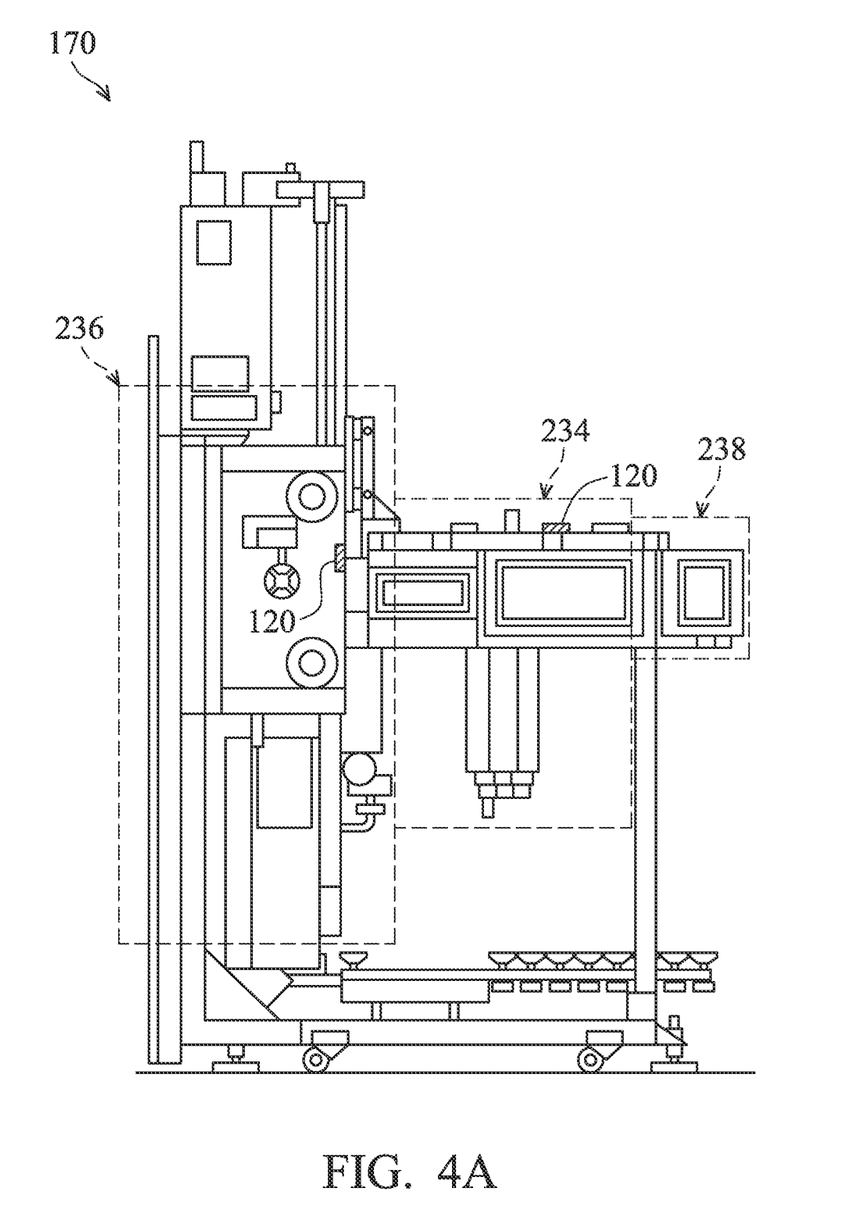
FIG. 4A illustrates a schematic of a wafer transportation apparatus in accordance with some embodiments.

FIG. 4A illustrates a schematic of a wafer transportation apparatus 170 in accordance with some embodiments. The wafer transportation apparatus 170 includes a transfer robot 234, a cassette module 236 and a gate door assembly 238. The cassette module 236 is arranged to load the wafer from other places to the transfer buffer 210. The transfer robot 234 is arranged to transport the wafer. The gate door assembly 238 is located between the transfer buffer 210 and the process chamber 220. In some embodiments, at least one target element 120 is arranged on a wafer carrying assembly, a cassette module 236 or a gate door assembly 238 of the wafer transportation apparatus 170. Therefore, by posting or placing a target element 120, any portion or location could be detected and positioned with the positioning calibration device of the present disclosure.

Figure 4B:
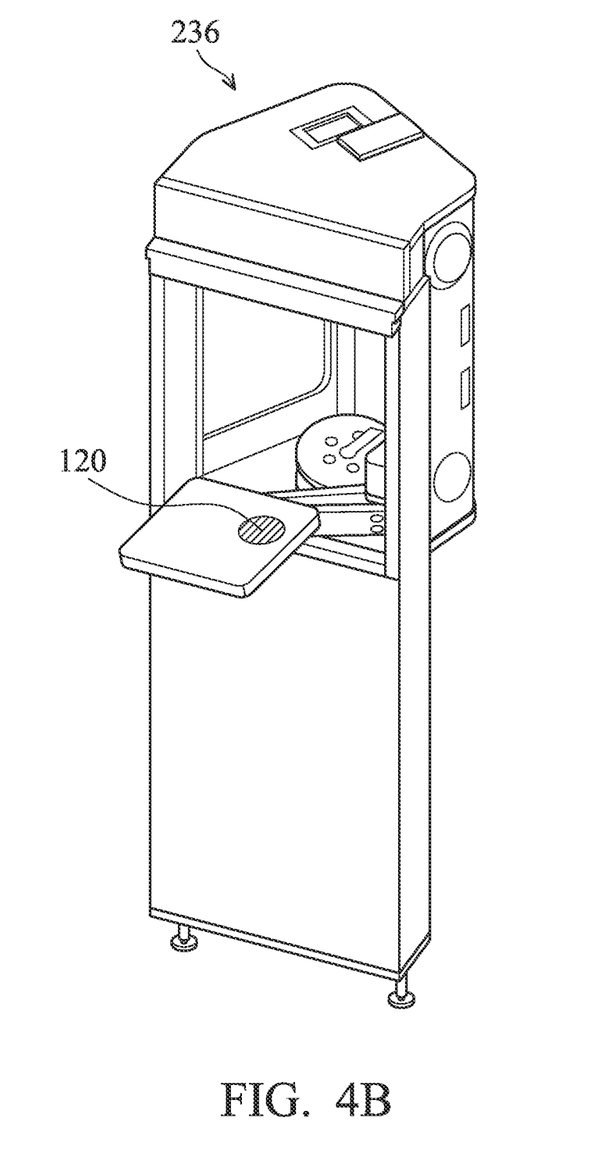
FIG. 4B illustrates a schematic of a cassette module in accordance with some embodiments.

FIG. 4B illustrates a schematic of a cassette module 236 in accordance with some embodiments. In some embodiments, the processor 162 generates the adjustment signal when the distance between one of the target elements 120 and a target position does not equal a pre-determined second value. As shown in FIG. 4B, a target element 120 is placed or posted on the door plate of the cassette module 236. In other words, when the door plate is closed, the distance between the target element 120 and a target position should be a fixed value of the second value. For example, the target position is the central point of the cassette module 236, and the second value could be pre-determined. If the door plate is closed, but the processor 162 detects that the distance between the target element 120 and the target position is smaller or larger than the second value, then the door plate might not be closed properly. Afterwards, the processor 162 transmits the adjustment signal to the encoder 164 to adjust or operate the cassette module 236. Therefore, the door plate of the cassette module 236 is positioned and calibrated automatically.

Figure 4C:
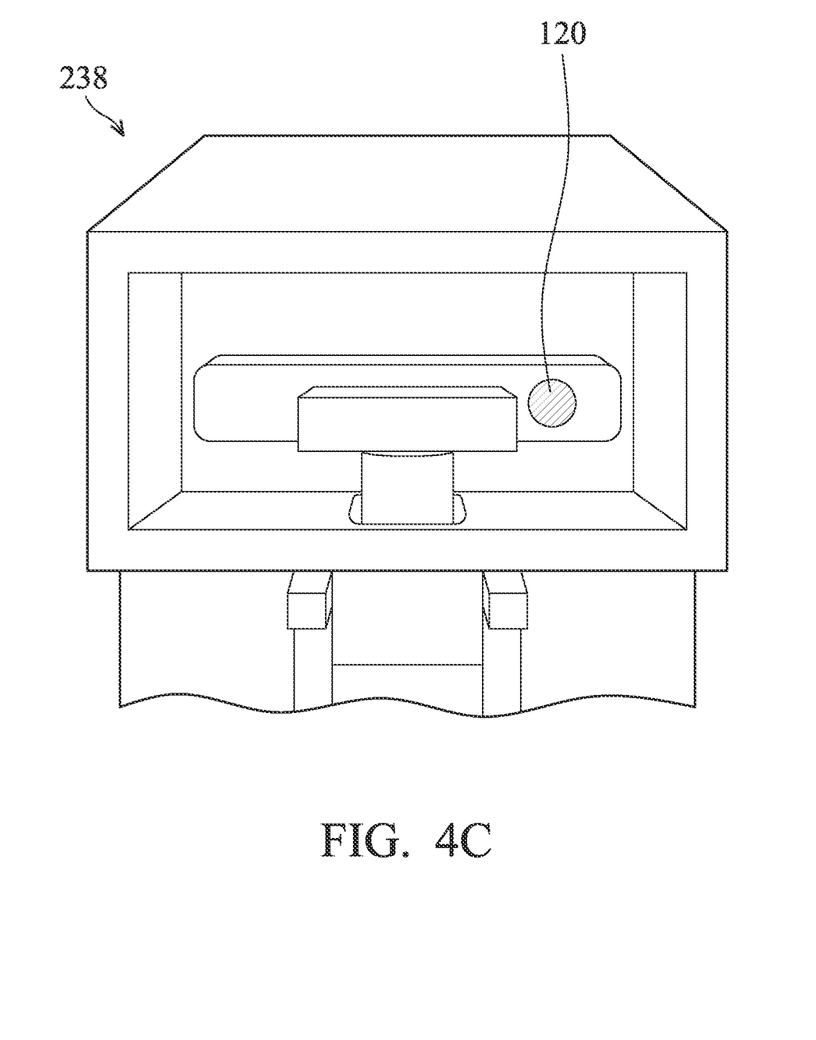
FIG. 4C illustrates a schematic of a gate door assembly in accordance with some embodiments.

FIG. 4C illustrates a schematic of a gate door assembly 238 in accordance with some embodiments. As shown in FIG. 4C, a target element 120 is placed or posted beside the entrance of the gate door assembly 238. Therefore, when the wafer is transported through the entrance of the gate door assembly 238, the distance between the target element 120 and a target position should be a fixed value of the second value. For example, the target position is the central point of the entrance of the gate door assembly 238, and the second value could be predetermined. If the wafer is transported through the entrance of the gate door assembly 238, but the processor 162 detects that the distance between the target element 120 and the target position is smaller or larger than the second value, then the wafer might not be transported properly. Afterwards, the processor 162 transmits the adjustment signal to the encoder 164 to adjust or operate the gate door assembly 238. Therefore, the gate door assembly 238 is positioned and calibrated automatically. It is to be understood that the cassette module 236 and the gate door assembly 238 are illustrated as examples, and are not limited to the disclosed embodiments. Each portion of the wafer transportation apparatus 170 could be automatically positioned and calibrated automatically with the disclosed method and device of the present disclosure.

Figure 5:
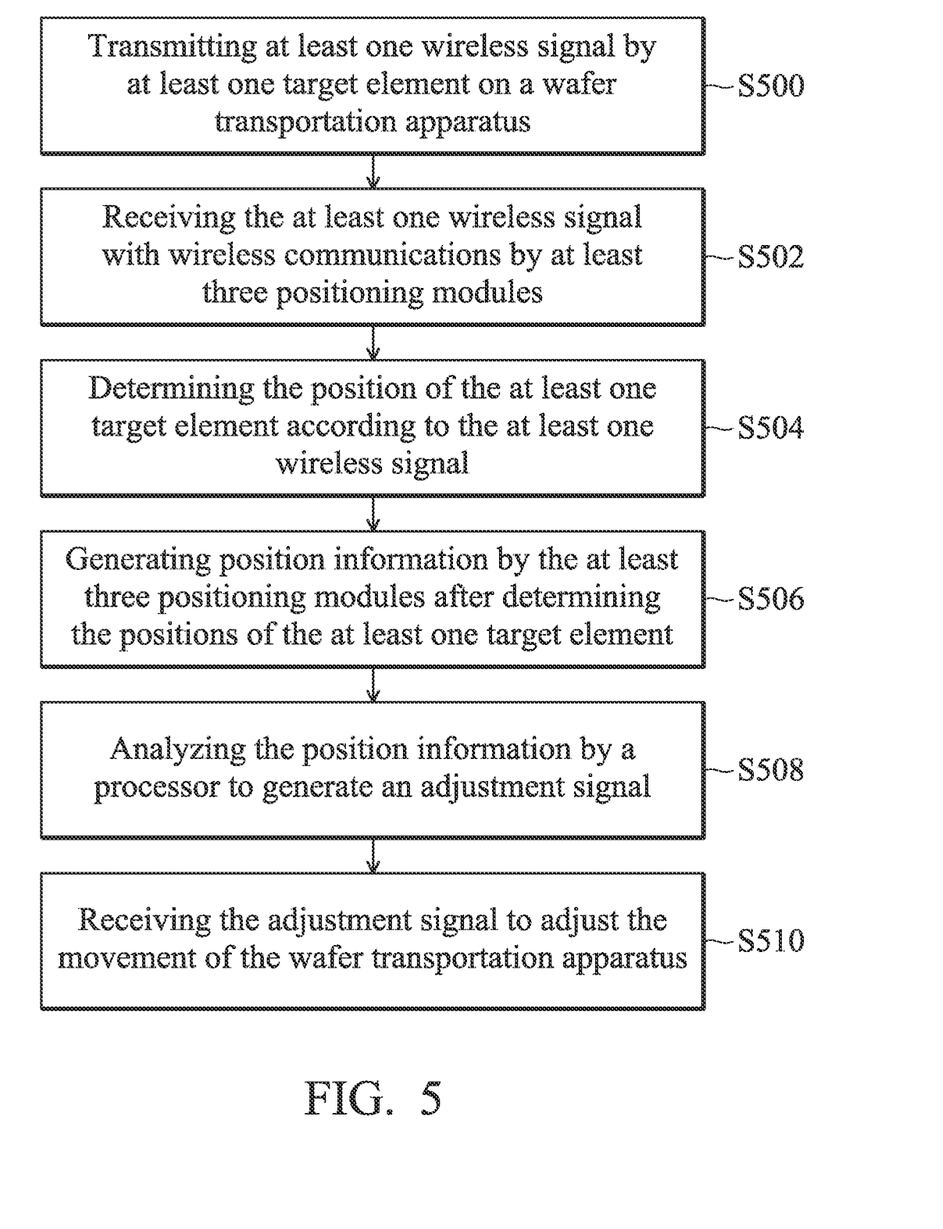
FIG. 5 illustrates a positioning and calibrating method for a wafer transportation apparatus in accordance with some embodiments.

FIG. 5 illustrates a positioning and calibrating method for a wafer transportation apparatus 170 in accordance with some embodiments. In operation S500, at least one wireless signal is transmitted by at least one target element 120 on a wafer transportation apparatus 170. Afterwards, in operation S502, the at least one wireless signal is received with wireless communications by at least three positioning modules. Afterwards, in operation S504, the at least three positioning modules 140 determine the position of the at least one target element according to the at least one wireless signal. Afterwards, in operation S506, the at least three positioning modules 140 generate position information after determining the positions of the at least one target element. Afterwards, in operation S508, the processor 162 analyzes the position information by a processor to generate an adjustment signal. Finally, in operation S510, the encoder 164 receives the adjustment signal to adjust or control the movement of the wafer transportation apparatus 170.

In accordance with some embodiments, a positioning calibration device arranged within a transfer buffer is provided. The positioning calibration device includes at least one target element and at least three positioning modules. The at least one target element is arranged on a wafer transportation apparatus within the transfer buffer. The transportation apparatus is utilized to transfer a wafer. The at least three positioning modules are utilized to detect the positions of the at least one target element by wireless communications for generating position information of the wafer transportation apparatus. The heights at which each of the at least three positioning modules is arranged are not the same.

In accordance with some embodiments, a positioning calibration device is provided. The positioning calibration device includes at least one target element, at least three positioning modules and a processor. The at least one target element is arranged on a wafer transportation apparatus. The transportation apparatus is utilized to transfer a wafer. The at least three positioning modules are utilized to develop a three-dimensional coordinates for positioning the at least one target element by wireless communications and generate position information of the wafer transportation apparatus. The processor is utilized to receive and analyze the position information for generating an adjustment signal and controlling the wafer transportation apparatus.

In accordance with some embodiments, a positioning and calibrating method for a wafer transportation apparatus is provided. The positioning and calibrating method for a wafer transportation apparatus includes transmitting at least one wireless signal by at least one target element, receiving the at least one wireless signal with wireless communications by at least three positioning modules, and determining the position of the at least one target element according to the at least one wireless signal.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A positioning calibration device, arranged within a transfer buffer, comprising:
   at least one target element arranged on a wafer transportation apparatus within the transfer buffer, wherein the transportation apparatus is configured to transfer a wafer; and
   at least three positioning modules arranged at locations in the transfer buffer, wherein the at least three positioning modules are utilized to detect the positions of the at least one target element by wireless communications for generating position information of the wafer transportation apparatus, each of the at least three positioning modules are arranged at a height in the transfer buffer, and the heights of the at least three positioning modules are not the same.

2. The positioning calibration device as claimed in claim 1, further comprising a control unit configured to receive the position information from the at least three positioning modules and adjust the movement of the wafer transportation apparatus according to the position information.

3. The positioning calibration device as claimed in claim 2, wherein the control unit is configured to continuously monitor the height of the at least one target element according to the position information.

4. The positioning calibration device as claimed in claim 1, wherein the at least one target element is configured to be charged wirelessly by a wireless power unit.

5. The positioning calibration device as claimed in claim 1, wherein positions of the at least three positioning modules are arranged as a triangle.

6. The positioning calibration device as claimed in claim 5, wherein the at least three positioning modules are arranged at corners of the transfer buffer.

7. The positioning calibration device as claimed in claim 1, wherein the at least one target element is arranged on a wafer carrying assembly, a cassette module or a gate door assembly of the wafer transportation apparatus.

8. The positioning calibration device as claimed in claim 1, wherein the at least one target element is an RFID tag and the at least three positioning modules are RFID readers.

9. A positioning calibration device, comprising:
   at least one target element, arranged on a wafer transportation apparatus, wherein the transportation apparatus is configured to transfer a wafer;
   at least three positioning modules, utilized to develop a set of three-dimensional coordinates for positioning the at least one target element by wireless communications and generate position information of the wafer transportation apparatus, wherein the at least three positioning modules are arranged at locations in a transfer buffer, each of the at least three positioning modules are arranged at a height in the transfer buffer, and the heights of the at least three positioning modules are not the same; and
   a processor, configured to receive and analyze the position information for generating an adjustment signal and controlling the wafer transportation apparatus.

10. The positioning calibration device as claimed in claim 9, wherein the at least three positioning modules position the at least one target element by detecting at least one wireless signal transmitted by the at least one target element.

11. The positioning calibration device as claimed in claim 9, further comprising a reference target element arranged at a fixed location to calibrate the three-dimensional coordinates with the at least three positioning modules.

12. The positioning calibration device as claimed in claim 9, further comprising an encoder to receive the adjustment signal from the processor for generating an encoding signal to control the movement of the wafer transportation apparatus.

13. The positioning calibration device as claimed in claim 9, wherein the processor is configured to analyze the position information with a statistical method and generates the adjustment signal when a standard deviation of the position information exceeds a first value.

14. The positioning calibration device as claimed in claim 9, wherein the processor is configured to generate the adjustment signal when a distance between one of the at least one target element and a target position is not equal to a second value.

15. A positioning and calibrating method for a wafer transportation apparatus, comprising:
   transmitting at least one wireless signal by at least one target element arranged on the wafer transportation apparatus;
   receiving the at least one wireless signal with wireless communications by at least three positioning modules arranged within a transfer buffer, wherein the at least three positioning modules are arranged at locations in a transfer buffer, each of the at least three positioning modules are arranged at a height in the transfer buffer, and the heights of the at least three positioning modules are not the same; and
   determining the position of the at least one target element according to the at least one wireless signal by a processor.

16. The positioning and calibrating method as claimed in claim 15, further comprising generating position information by the at least three positioning modules after determining the positions of the at least one target element.

17. The positioning and calibrating method as claimed in claim 16, further comprising analyzing the position information by the processor to generate an adjustment signal.

18. The positioning and calibrating method as claimed in claim 17, further comprising receiving the adjustment signal to adjust the movement of the wafer transportation apparatus.

19. The positioning and calibrating method as claimed in claim 17, wherein the operation of analyzing the position information is implemented with a statistical method to generate the adjustment signal when the standard deviation of the position information exceeds a first value.

* * * * *